(12) United States Patent
Kern et al.

(10) Patent No.: US 11,892,906 B2
(45) Date of Patent: Feb. 6, 2024

(54) METHOD FOR MEMORY STORAGE AND ACCESS

(71) Applicant: Infineon Technologies AG, Neubiberg (DE)

(72) Inventors: Thomas Kern, Aschheim (DE); Thomas Rabenalt, Unterhaching (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 246 days.

(21) Appl. No.: 17/392,415

(22) Filed: Aug. 3, 2021

(65) Prior Publication Data

US 2022/0044753 A1   Feb. 10, 2022

(30) Foreign Application Priority Data

Aug. 5, 2020 (DE) .................... 10 2020 120 719.0

(51) Int. Cl.
| | | |
|---|---|---|
| *G06F 11/00* | (2006.01) | |
| *G06F 11/08* | (2006.01) | |
| *G11C 29/42* | (2006.01) | |
| *G11C 29/18* | (2006.01) | |
| *G11C 29/44* | (2006.01) | |
| *G06F 11/10* | (2006.01) | |

(52) U.S. Cl.
CPC .......... *G06F 11/08* (2013.01); *G06F 11/1012* (2013.01); *G11C 29/18* (2013.01); *G11C 29/42* (2013.01); *G11C 29/4401* (2013.01)

(58) Field of Classification Search
CPC .. G06F 11/08; G06F 11/1012; G06F 11/1016; G06F 11/10; G11C 29/42; G11C 29/16; G11C 29/4401
See application file for complete search history.

(56) References Cited

U.S. PATENT DOCUMENTS

| | | | |
|---|---|---|---|
| 2009/0019321 A1 | 1/2009 | Radke | |
| 2012/0303893 A1* | 11/2012 | Benhase | ................ G06F 11/10 711/E12.001 |
| 2016/0299812 A1* | 10/2016 | Olbrich | .................. G06F 3/061 |
| 2019/0132006 A1 | 5/2019 | Kern et al. | |
| 2019/0278598 A1* | 9/2019 | Bhardwaj | ................. G06F 9/32 |
| 2019/0312601 A1 | 10/2019 | Kern et al. | |
| 2022/0035706 A1* | 2/2022 | Laurent | ............... G06F 11/1012 |

FOREIGN PATENT DOCUMENTS

TW     200907989 A    2/2009

* cited by examiner

*Primary Examiner* — Joseph D Manoskey
(74) *Attorney, Agent, or Firm* — Eschweiler & Potashnik, LLC

(57) ABSTRACT

A method for storing data bits in memory cells, in which the data bits have at least one byte-filling bit, where at least one predefined functionality for a subset of the data bits is coded in the at least one byte-filling bit, and in which the data bits are stored in the memory cells. A method for reading data bits from memory cells, in which the data bits have at least one byte-filling bit, where at least one predefined functionality for a subset of the data bits is coded in the at least one byte-filling bit, and in which the data bits are read from the memory cells based on the coded predefined functionality. Corresponding apparatuses and memories are also disclosed.

17 Claims, 1 Drawing Sheet

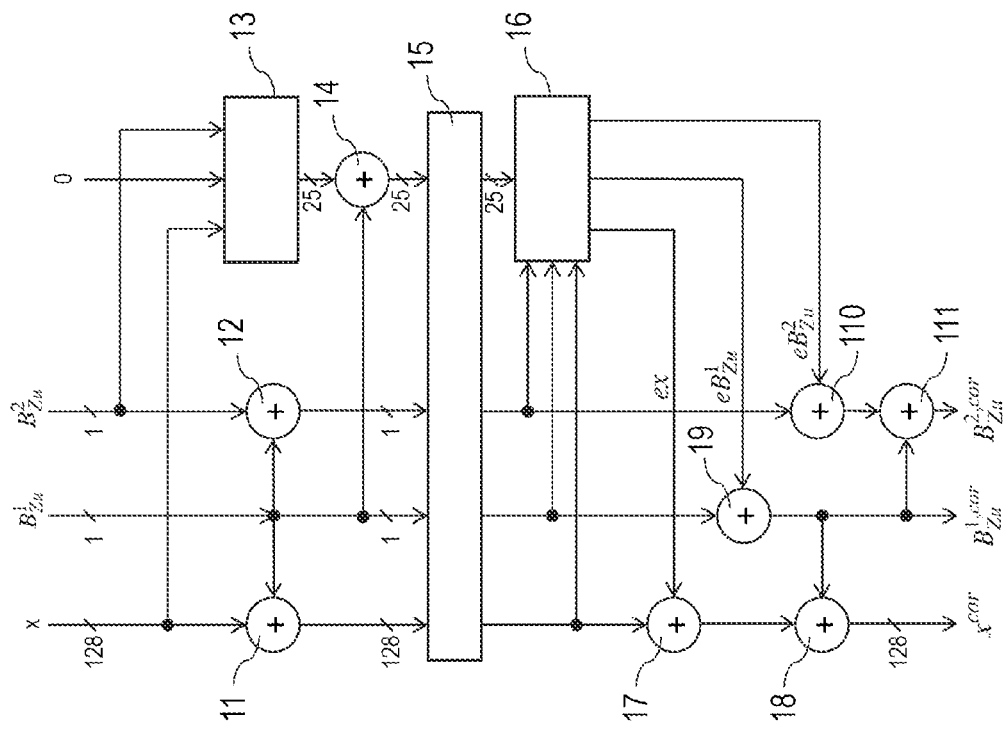

METHOD FOR MEMORY STORAGE AND ACCESS

REFERENCE TO RELATED APPLICATION

This application claims priority to German Application No. 102020120719.0, filed on Aug. 5, 2020, the contents of which are hereby incorporated by reference in their entirety.

BACKGROUND

Complementary memory cells may be used, for example, to store 1 bit in two memory cells which are complementary to one another. Each of the memory cells may have a physical value corresponding to a distribution, for example a cell current distribution. This physical value may be either in a first distribution or in a second distribution which may differ from the first distribution or may not have any overlapping area or may have only a small overlapping area with the first distribution. If the physical value of the memory cell is assigned to the first distribution, the memory cell has the value "H", whereas, if the physical value of the memory cell is assigned to the second distribution, the memory cell has the value "L".

The individual bit may be stored in the complementary memory cell pair as follows:

If the bit has the information logic "1", the first memory cell has the value "H" and the second memory cell has the value "L".

If the bit has the information logic "0", the first memory cell has the value "L" and the second memory cell has the value "H".

The complementary memory cells make it possible to improve the robustness of the stored bit. However, it may be disadvantageous that two physical memory cells are utilized for an individual information bit, that is to say the overhead is 100%.

The overhead can be considerably reduced by using complementary memory cells in conjunction with an x/2-of-x code. For example, a 3-of-6 code comprises those code words in which 3 bits of the 6 bits have the value "1" (accordingly, the other 3 bits then always have the value "0"). In some examples, there are therefore 20 valid code words of the 3-of-6 code. The 3-of-6 code can therefore be used to represent 24=16 different bit combinations and there are then 20−16=4 unused bits. In this example, the overhead is (6−4)/4=50%.

In some examples, there are 70 code words in a 4-of-8 code. The next smaller power of two is 64=26, that is to say 64 bit combinations can be represented and there is a surplus of 70−64=6 unused bits. In this example, the overhead is (8−6)/6=33%.

Some storage concepts comprise groups of bits (also referred to as words) which usually occur in powers of 2: 32, 64, 128, 256, etc. These words can be divided into bytes, wherein each byte comprises a fixed number of bits. An example application uses a byte size of 6 bits. Therefore, a code word of the 3-of-6 code can be stored for each byte. According to this example, 43 bytes are needed to store 256 bits (43·6=258>256). This results in 2 surplus bits, also referred to as byte-filling bits.

SUMMARY

The present disclosure relates to a method and apparatus for improved memory storage and access.

In some embodiments, a method for storing data bits in memory cells is disclosed:
in which the data bits have at least one byte-filling bit, wherein at least one predefined functionality for a subset of the data bits is coded in the at least one byte-filling bit, and
in which the data bits are stored in the memory cells.

In some embodiments, the data bits are stored in the memory cells on the basis of the coded functionality.

In some embodiments, the subset of data bits comprises the data bits without the at least one byte-filling bit.

In some embodiments, the subset of data bits comprises all data bits.

In some embodiments, the predefined functionality for each byte-filling bit comprises one of the following possibilities:
a first value of the byte-filling bit indicates that the subset of data bits is stored in an inverted manner and a second value of the byte-filling bit indicates that the subset of data bits is stored in a non-inverted manner;
a first value of the byte-filling bit indicates that the subset of data bits is invalid and a second value of the byte-filling bit indicates that the subset of data bits is valid;
a first value of the byte-filling bit indicates that the subset of data bits can be overwritten and a second value of the byte-filling bit indicates that the subset of data bits cannot be overwritten;
a first value of the byte-filling bit indicates that the subset of data bits cannot be read and a second value of the byte-filling bit indicates that the subset of data bits can be read;
a first value of the byte-filling bit indicates that the subset of data bits is protected and a second value of the byte-filling bit indicates that the subset of data bits is not protected.

It should be noted in this case that, when the byte-filling bit indicates, for the subset of data bits, that they are intended to be stored in an inverted manner, these data bits stored in an inverted manner are part of a code word of the byte error code in the error-free case. In addition, it is an option for the subset of data bits to be part of a code word of the byte error code in the error-free case irrespective of whether the byte-filling bit indicates, for this subset, that the data bits should be stored in an inverted or non-inverted manner. Therefore, a code word can be assumed on the basis of the subset of data bits in the error-free case irrespective of whether or not there is inversion.

In some embodiments, at least one of the plurality of byte-filling bits is used to detect errors in the data bits.

For example, this at least one additional byte-filling bit which is used to detect errors can be used to determine an XOR sum (parity) for the data bits or for a selection of the data bits. A simple bit error can be additionally detected on the basis of the XOR sum.

In some embodiments:
the data bits are grouped, together with check bits, into bytes, wherein at least one of these bytes can be corrected on the basis of a byte error code, and
the data bits and the check bits are stored in the memory cells.

For example, the byte error code may be a Reed-Solomon code or a shortened Reed-Solomon code. It is also an option for the Reed-Solomon code to be a 1-byte error-correcting and 2-byte error-detecting code. A further option is for the Reed-Solomon code to be a 1-byte error-correcting code which can detect both 2-byte errors and 3-byte errors.

In some embodiments, in the error-free case, the data bits and the check bits represent a code word of the byte error code or are parts of a code word of the byte error code.

In some embodiments,
the byte error code has N check bytes having check bits,
a byte comprises m bits,
wherein there is a byte which has K byte-filling bits and m−K data bits,
wherein m is determined as the smallest positive integer, with the result that $$m \cdot (2^m - 1) \geq n + (N \cdot m) + K,$$

where m≥3, 1≤K≤m−1, N≥2 and n>(N+2)·m, and
where n is a number of data bits.

In some embodiments, the check bits are determined on the basis of address bits.

The address bits are bits for addressing the memory cells. The memory cells are preferably part of a memory which can be addressed using an address. It should be noted that the check bits can be determined on the basis of address bits; these may directly be the address bits or information derived from address bits.

In some embodiments:
the byte error code has N check bytes,
the byte error code has R address bytes determined from address bits,
wherein a byte comprises m bits,
wherein there is a byte which has K byte-filling bits and m−K data bits,
wherein m is determined as the smallest positive integer, with the result that $$m \cdot (2^m - 1) \geq n + (N \cdot m) + (R \cdot m) + K,$$

where m≥3, 1≤K≤m−1, N≥2, R≥1 and n>(N+R+2)·(m), and
where n is a number of data bits.

In some embodiments, the address bits are part of the code word of the byte error code.

The address bits (comprising information possibly derived from address bits) may be included in the code word of the byte error code in the form of bytes or as parts of bytes. In principle, address bits may be bits of a read address or a write address.

The address bits themselves are preferably not concomitantly stored, but rather are used only to create the code word. If the read address is not the same as the previously used write address (which resulted in the code word which has been read), there is an address error. It is sufficient to detect the address error. It is usually not expedient and, in this respect, also not necessary to correct the address error. A detected address error may initiate a corresponding action, for example error handling, output of a message, stopping of the processing, etc.

For example, the address bits are not part of the data bits and are therefore not affected by the coded functionality (for example inversion which is indicated by the value of a byte-filling bit). In this case, the address bits are processed in a non-inverted manner.

In some embodiments, the address bits are not part of the code word of the byte error code.

A method for reading data bits from memory cells is also disclosed:
in which the data bits have at least one byte-filling bit, wherein at least one predefined functionality for a subset of the data bits is coded in the at least one byte-filling bit, and
in which the data bits are read from the memory cells on the basis of the coded functionality.

If the value of a byte-filling bit indicates that the subset of data bits is inverted, for example, this can be taken into account in the read operation by restoring (that is to say inverting) the data bits in this subset which have been read to the non-inverted state. It should be noted that the inversion can be carried out after reading before or after correcting an error detected by means of the byte error code.

In some embodiments,
it is determined, on the basis of the data bits which have been read, whether there is a code word of a byte error code, and
if there is no code word of the byte error code, at least one error is detected and/or at least one error is corrected.

In some embodiments, if there is a code word of the byte error code and if at least one detected error has been corrected, the data bits which have been read are processed further.

If only at least one error has been detected or it has been determined that no error correction is possible, a predefined action can be carried out. For example, an alarm can be triggered, a counter can be incremented or exception handling can be initiated.

An apparatus for storing data bits in memory cells of a memory is also disclosed,
wherein the data bits have at least one byte-filling bit, wherein at least one predefined functionality for a subset of the data bits is coded in the at least one byte-filling bit, and
wherein the apparatus is configured to store the data bits in the memory cells.

An apparatus for reading data bits from memory cells of a memory is also disclosed,
wherein the data bits have at least one byte-filling bit, wherein at least one predefined functionality for a subset of the data bits is coded in the at least one byte-filling bit,
wherein the apparatus is configured to read the data bits from the memory cells on the basis of the coded functionality.

The apparatus for writing the data bits may be the same apparatus as the apparatus for reading the data bits.

In some embodiments, the apparatus is part of the memory or part of a memory management system.

The memory management system may be hardware and/or software which carries out or coordinates the management of the data bits which have been written to the memory and/or read from the memory.

In some embodiments, the memory comprises at least one of the following components:
a cache memory,
a register or a register array,
a flash memory,
an MRAM,
an SRAM,
an RE-RAM,
a PC-RAM,
an FE-RAM,
a CB-RAM,
a multi-bit memory,
a multi-level memory.

An apparatus for processing data organized in data bits is also disclosed, which apparatus is configured to carry out the steps of the method described herein.

The apparatus may be part of the memory or may be separate from the latter. In particular, the apparatus may comprise a processing unit which carries out the steps mentioned here. The apparatus and/or the processing unit may comprise at least one of the following components: a processor, a microcontroller, a circuit, an ASIC, an FPGA, a logic unit. The processing unit may be implemented in the form of at least one physical unit. In particular, the processing unit may be distributed among a plurality of physical units.

The above explanations relating to the methods accordingly apply to the apparatus. The steps of the method which are described here can be carried out by means of the apparatus.

The above-described properties, features and advantages of embodiments of the disclosure and the manner in which they are achieved are described below in connection with a schematic description of example embodiments which are explained in more detail in connection with the drawing. In this case, identical or identically acting elements may be provided with identical reference signs for the sake of clarity.

BRIEF DESCRIPTION OF THE DRAWINGS

FIG. 1 shows an example circuit arrangement comprising a memory, to which there may be write or read access, wherein at least one additional functionality is provided on the basis of at least one byte-filling bit.

DETAILED DESCRIPTION

Byte error-correcting and/or byte error-detecting codes can be used to correct and/or detect errors in data stored in memory cells. Such codes are also referred to as byte error codes below.

Data bits (e.g., $x=x_1, \ldots, x_n$) can be combined to form groups of m bits in each case. Each group of this type then comprises a so-called byte having a number of m bits (also referred to as a data byte).

At least one data byte can be supplemented by at least one check byte of a byte error-correcting code. A cyclical byte error-correcting code or a shortened code, for example a Reed-Solomon code, can be used as the byte error code, for example.

If there are, for example, n=256 data bits and data bytes having m=8 bits, the 256 data bits x1, . . . , x256 are divided into 32 data bytes each of 8 bits. The 32 data bytes may be supplemented, for example, by 3 check bytes, wherein each check byte comprises 8 bits. The 32 data bytes and the 3 check bytes may determine a code word of a Reed-Solomon code which can correct 1-byte errors and can detect 2-byte errors. In this example, m is a divisor of n, with the result that m÷n=256÷8=32 without a remainder.

If there are, for example, n=70 data bits x=x1, . . . , x70 and if m=6, data bytes each with 6 bits result. In this case, n÷m=70÷6=11 data bytes may be formed and a remainder of 4 data bits remains. In addition to the 4 remaining data bits x67, x68, x69 and x70, two byte-filling bits Bf1, Bf2 may be added in order to thus form a twelfth byte (which likewise comprises 6 bits). Adding the byte-filling bits means that all 70 data bits are part of a data byte of 6 bits each. The 12 data bytes obtained in this manner can be supplemented by adding check bytes having a length of 6 bits. These 12+1 bytes each with 6 bits may form a code word of a byte error code. This is merely a numerical example. In particular, m, n, the number of byte-filling bits, the number of check bits and/or the number of check bytes may vary.

For example, byte-filling bits are added when the result of the division m÷n is not an integer or when m is not a divisor of n because a remainder that is not equal to 0 remains.

If, for example, a Reed-Solomon code having m-bit bytes is used, the maximum number of bytes in a code word, which comprises data bytes and check bytes, is equal to 2·m−1, and the maximum number of bits in a code word is equal to m·(2m−1).

A number N of check bytes is determined by how many check bytes are needed to guarantee the desired detection and/or correction of byte errors. For example, the following approaches apply:

If 1-byte errors are intended to be corrected, the number of check bytes is N=2.

If 1-byte errors are intended to be corrected and 2-byte errors are intended to be detected, the number of check bytes is N=3.

If 2-byte errors are intended to be corrected and 3-byte errors are intended to be detected, the number of check bytes is N=5.

The following condition therefore applies to the number of data bits n:

$$n+K \leq m \cdot [(2^m-1)-N] \qquad (1)$$

where K is the number of byte-filling bits resulting from the remainder of the division n÷m.

For a predefined number of data bits n to be stored and a predefined number N of check bytes needed for error handling, the size m of the individual bytes may be determined, for example, in such a manner that equation (1) is satisfied and m is as small as possible in this case. The number K of byte-filling bits is then determined by the remainder of the division n÷m.

Some Examples for determining a smallest possible byte size m are discussed below.

By way of example, n=64 data bits $x_1, \ldots, x_{64}$ are intended to be stored using a Reed-Solomon code. However, the condition formulated in equation (1) cannot be satisfied with m=4 since:

$$4 \cdot (2^4-1)=60<64.$$

If, however, a byte size of m=5 bits is used, the following results $$5 \cdot (2^5-1)=155>64.$$

The following also follows:

$$64 \div 5=12 \text{ remainder } 4.$$

The first 60 data bits $x_1, \ldots, x_{60}$ form twelve data bytes having a size of 5 bits. The 4 remaining data bits $x_{61}, \ldots, x_{64}$ and a byte-filling bit $B^f_1$ form a further (thirteenth) byte having a size of likewise 5 bits. In addition to the thirteen bytes, 3 check bytes may be added, for example, if a 1-byte error-correcting and 2-byte error-detecting Reed-Solomon code is used. Overall, the result is therefore 12+1+13=16 bytes each with 5 bits or 16·5=80 bits. 80 memory cells are needed to store these 80 bits. The totality of these 80 memory cells or 16 bytes is also referred to as a word.

If, in contrast, a byte-filling bit is not used, a byte size of at least m=8 bits is required: 8 data bytes each with 8 bits result for the 64 data bits x1, . . . , x64. On account of the 1-byte error-correcting and 2-byte error-detecting Reed-Solomon code, 3 check bytes each with 8 bits are added. In total, the result is 8+3=11 bytes each with 8 bits, that is to say 11·8=88 bits.

If the two examples above are compared, it is revealed that only 80 bits instead of 88 bits are required for each word if a byte-filling bit is used.

Assignment Bits

Byte-filling bits are also referred to in the present case as assignment bits or byte-filling assignment bits. They are used, in particular, to assign the bits of the data bytes (or a subset thereof) and possibly the bits of the check bytes of the byte error code used to different functionalities. The different functionalities may be coded in a value of a byte-filling bit or in a plurality of values of byte-filling bits.

For example, a first value of an assignment bit may specify that the subset of data bits is inverted. A second value of this assignment bit may accordingly stipulate that this subset of data bits is not inverted. Depending on the value of this assignment bit, the bits in the subset are therefore used as inverted bits or as non-inverted bits. This may concern a storage operation whereby the data bits are inverted before being stored or a read operation whereby the data bits which have been read are processed further in an inverted manner.

Another option is for a first value of an assignment bit to determine that a predefined set of data bits and/or check bits is valid and for a second value of the assignment bit to determine that the predefined set of data bits and/or check bits is invalid. As stated above, the data bits and/or check bits may be organized in bytes. The "validity" functionality of data bits and/or check bits is therefore provided with this assignment bit.

It is also an option for a first value of an assignment bit to determine that a predefined set of data bits and/or check bits can be overwritten and for a second value of the assignment bit to determine that the predefined set of these bits cannot be overwritten and can only be read, for example. Depending on the value of the assignment bit, the bits in the predefined subset can therefore be identified and used as bits which can be overwritten or bits which cannot be overwritten. The functionality whereby a predefined subset of bits can be overwritten or cannot be overwritten can be coded as the value of the corresponding assignment bit.

These (and other) functionalities can occur individually or in combination with one another. One assignment bit is preferably provided for each functionality, with the result that different functionalities can be coded in the values of different assignment bits in this case.

It is also possible for more complex functionalities, which require a selection from more than two values or can be parameterized using more than two values, to be coded by a plurality of assignment bits. For example, a complex functionality may be linked to 2 assignment bits. The two assignment bits may assume $2^2=4$ values. Each of these values may be a parameter of the functionality, with the result that the functionality can be provided in four different forms, depending on the values of the assignment bits.

As explained above, byte-filling bits are initially used to reduce the number of memory cells needed when storing and correcting bits using byte error codes. In addition, their use as assignment bits additionally makes it possible to implement at least one functionality in order to specify, for example, whether a subset of bits:

is inverted or not inverted, is valid or invalid, can be overwritten or cannot be overwritten.

The reliability and correctness of the stored bits can therefore be improved, for example.

It is also advantageous that, in the error-free case, the assignment bits are part of a code word of a byte error code. It is therefore possible to also detect and/or correct errors in the assignment bits by means of the byte error code.

In particular, it is an option to reduce the number of bits needed to detect and/or correct errors by using byte-filling bits.

By virtue of different values of the assignment bits, bits of data bits can be interpreted as inverted or non-inverted bits. For example, this makes it possible to correct a so-called stuck-at error of a memory cell by inverting a bit to be stored in the memory cell before being stored. If the inversion is not implemented during storage, the memory cell is defective. The value of the assignment bit may indicate, for a group of bits, whether they have been stored in an inverted or non-inverted manner.

Furthermore, bits of data bits can be identified as valid or invalid bits by virtue of different values of assignment bits. This makes it possible to prevent invalid bits from being (incorrectly) used, for example.

A further option is for different values of assignment bits to indicate whether bits in a group of bits can be overwritten or cannot be overwritten.

Assignment bits can also indicate whether bits in a group of bits are intended to be interpreted as externally readable or non-readable.

Furthermore, a byte-filling bit can be used to detect errors in bits of data bytes, in bits of check bytes and/or in bits of address bytes or in bits of address bytes derived from address bits. For example, a byte-filling bit can be used as a check bit of data bits. A byte-filling bit can therefore be used as a parity of data bits, in particular as a parity of all data bits (or a predefined selection of data bits). This is advantageous, in particular, when there are at least two byte-filling assignment bits. After the bytes have been corrected using the byte error code, it is additionally possible to use a byte-filling bit to check whether the corrected data bits of the bytes of the byte error code have the correct parity, with the result that an odd bit error which remained after correction by means of the byte error code can be detected.

Further Examples and Advantages

According to one example implementation, the intention is to consider n=128 data bits x1, . . . , x128 which are stored in memory cells and are protected against errors using the Reed-Solomon code. Explanations of the Reed-Solomon code are disclosed, for example, in Wicker, S.: Error Control Systems for Digital Communications and Storage Systems, Prentice Hall, 1995, pages 186 to 189, 214 to 224, Rao, T.; Fujiwara, E.: Error control Coding for Computer Systems, Prentice Hall, 1989, pages 109 to 114, Lin, S.; Costello, D.: Error Control Coding, Prentice Hall, 2005, pages 236 to 240, or Bossen, D. C.: b-Adjacent Error Correction, IBM J. Res. and Dev., 1970, pages 402 to 408.

If 2-byte errors are intended to be corrected and 3-byte errors are intended to be detected using the Reed-Solomon code, N=5 check bytes are used. For the number m of bits in a byte, the following applies according to equation (1) with n=128:

$$128 + K \leq m \cdot [(2^m - 1) - 5]. \qquad (2)$$

Equation (2) cannot be satisfied for m=4. For m=5, the following results as the smallest positive integer for the number K of byte-filling bits K=2:

$$128+2=130 \leq 5 \cdot [(2^5-1)-5] = 5 \cdot 26 = 130. \quad (3)$$

The 125 first data bits $$x_1, \ldots, x_{125}$$

form $$n \div m = 125 \cdot 5 = 25$$

data bytes $$b_x^1, \ldots, b_x^{25}$$

each with 5 bits:

$$b_x^1 = [x_1, \ldots, x_5]$$

$$b_x^2 = [x_6, \ldots, x_{10}]$$

$$b_x^3 = [x_{11}, \ldots, x_{15}]$$

$$\ldots$$

$$b_x^{25} = [x_{121}, \ldots, x_{125}].$$

A subsequent twenty-sixth byte $$b_{x,Bf}^{26}$$

comprises the remaining three data bits $x_{126}$, $x_{127}$, $x_{128}$ and additionally two byte-filling assignment bits $B_{Bf}^1$ and $B_{Bf}^1$:

$$b_{x,Bf}^{26} = [x_{126}, x_{127}, x_{128}, B_{Bf}^1, B_{Bf}^2].$$

There are also N=5 check bites $$b_c^1, b_c^2, b_c^3, b_c^4, b_c^5$$

each comprising 5 check bits. The following therefore applies to the 5·5=25 check bits $c_1, \ldots, c_{25}$:

$$b_c^1 = [c_1, \ldots, c_5],$$

$$b_c^2 = [c_6, \ldots, c_{10}],$$

$$b_c^3 = [c_{11}, \ldots, c_{15}],$$

$$b_c^4 = [c_{16}, \ldots, c_{20}],$$

$$b_c^5 = [c_{21}, \ldots, c_{25}],$$

The Reed-Solomon code used can be described by its H-matrix $H_{RS_{2,3}}$ with $$H_{RS_{2,3}} = \begin{pmatrix} H_1 \\ H_2 \\ H_3 \\ H_4 \\ H_5 \end{pmatrix} = \begin{pmatrix} \alpha^0 & \alpha^1 & \alpha^2 & \alpha^3 & \ldots & \alpha^{30} \\ \alpha^0 & \alpha^2 & \alpha^4 & \alpha^6 & \ldots & \alpha^{2\cdot 30} \\ \alpha^0 & \alpha^3 & \alpha^6 & \alpha^9 & \ldots & \alpha^{3\cdot 30} \\ \alpha^0 & \alpha^4 & \alpha^8 & \alpha^{12} & \ldots & \alpha^{4\cdot 30} \\ \alpha^0 & \alpha^5 & \alpha^{10} & \alpha^{15} & \ldots & \alpha^{5\cdot 30} \end{pmatrix} \quad (4)$$

The exponents of $\alpha$ should be interpreted modulo 31. The code is cyclic.

All elements $\alpha 0, \alpha 1, \ldots, \alpha 30$ are elements of the Galois field GF(25). Each of these elements is not equal to 0. In their vector representation, these elements assume all 31 possible 5-bit binary vectors not equal to [0, 0, 0, 0, 0] and the component-by-component XOR sum of all of these 31 elements, which corresponds to their addition in the Galois field GF($2^5$), is equal to [0,0,0,0,0]=0.

Since $2^5-1=31$ is a prime number, the elements $\alpha^1$, $\alpha^2$, $\alpha^3$, $\alpha^4$ and $\alpha^5$ are generating elements of the Galois field GF($2^5$). Precisely all 31 different elements of the Galois field GF($2^5$) occur in each row of the H-matrix $H_{RS_{2,3}}$. The following therefore applies to their sums in the Galois field GF($2^5$):

$$\sum_0^{30} \alpha^i = \sum_0^{30} \alpha^{2i} = \sum_0^{30} \alpha^{3i} = \sum_0^{30} \alpha^{4i} = \sum_0^{30} \alpha^{5i} = 0. \quad (5)$$

According to Rao, T.; Fujiwara, E.: Error control Coding for Computer Systems, Prentice Hall, 1989, pages 222 to 225, a 5×5 matrix $T^i$ with $$T^i = [\alpha^i |, \alpha^{i+1}|, \alpha^{i+2}|, \alpha^{i+3}|, \alpha^{i+4}|] \quad (6)$$

can be used as a binary representation, where $T^0$ is the 5×5 unit matrix. In this case, $\alpha^i|$, $\alpha^{i+1}|$, $\alpha^{i+2}|$, $\alpha^{i+3}|$, $\alpha^{i+4}|$ are representations of the elements $\alpha^i$, $\alpha^{i+1}$, $\alpha^{i+2}$, $\alpha^{i+3}$, $\alpha^{i+4}$ in their vector representation as 5-dimensional column vectors (see, for example, Lin, S.; Costello, D.: Error Control Coding, Prentice-Hall, 2005, pages 1204 to 1226 for the modular polynomial $x^5+x^2+1$ of the Galois field GF($2^5$)).

If the bits $$x_1, \ldots, x_{128}, B_{Bf}^1, B_{Bf}^2, c_1, \ldots, c_{25}$$

are inverted to form $$\overline{x}_1 = x_1 + 1,$$
$$\vdots$$
$$\overline{x}_{128} = x_{128} + 1,$$
$$\overline{B}_{Bf}^1 = B_{Bf}^1 + 1,$$
$$\overline{B}_{Bf}^2 = B_{Bf}^2 + 1,$$
$$\overline{c}_1 = c_1 + 1,$$
$$\vdots$$
$$\overline{c}_{25} = c_{25} + 1,$$

the following applies:

$$\underbrace{\overline{x}_1, \ldots, \overline{x}_{125}}_{\overline{b}_x^4, \ldots \overline{b}_x^{25}}, \underbrace{\overline{x}_{126}, \overline{x}_{127}, \overline{x}_{128}, \overline{B}_{Bf}^1, \overline{B}_{Bf}^2}_{\overline{b}_{x,Bf}^{26}}, \underbrace{\overline{c}_1, \ldots, \overline{c}_{25}}_{\overline{b}_c^1, \ldots \overline{b}_c^5} == \overline{b}_x^1, \ldots, \overline{b}_x^{25}, \quad (7)$$

$$\overline{b}_{x,Bf}^{26}, \overline{b}_c^1, \ldots, \overline{b}_c^5 == b_x^1, \ldots, b_x^{25}, b_{x,Bf}^{26}, b_c^1, \ldots, b_c^5 + \underbrace{\alpha^{15}, \ldots, \alpha^{15}}_{31}.$$

Equation (7) applies because the vector representation of $\alpha 15$ is equal to (1, 1, 1, 1, 1) and the component-by-component binary addition of the value 1 to all bits can be described as the byte-by-byte addition of $\alpha 15$ to all bytes (compare: Lin, S.; Costello, D.: Error Control Coding, Prentice-Hall, 2005, pages 1204 to 1226). The vector representation [11111] for the element $\alpha 15$ for the Galois field GF(25) is presented in said citation.

If the bytes $$b_x^1, \ldots, b_x^{25}, b_{x,Bf}^{26}, b_c^1, \ldots, b_c^5$$

are a code word of the Reed-Solomon code, the inverted bytes $$\overline{b}_x^1, \ldots, \overline{b}_x^{25}, \overline{b}_{x,Bf}^{26}, \overline{b}_c^1, \ldots, \overline{b}_c^5$$

are likewise a code word because $$\underbrace{\alpha^{15}, \ldots, \alpha^{15}}_{31}$$

is a code word since $$H_{RS} \cdot [\underbrace{\alpha^{15}, \ldots, \alpha^{15}}_{31}] = \alpha^{15} \cdot H_{RS} \cdot [\underbrace{\alpha^0, \ldots, \alpha^0}_{31}] = 0 \quad (8)$$

because equation (5) is satisfied and $$H_{RS} \cdot [\underbrace{\alpha^0, \ldots, \alpha^0}_{31}]$$

is equal to the component-by-component modulo 2 sum of all columns of $H_{RS}$. In this case, $$[\underbrace{\alpha^0, \ldots, \alpha^0}_{31}]$$

is a column vector of components $\alpha^0$ of the Galois field $GF(2^5)$, and the factor $\alpha^{15}$ in equation (8) is also an element of the Galois field $GF(2^5)$.
Likewise, $$[\underbrace{\alpha^J, \ldots, \alpha^J}_{31}]$$

is, for any desired $J \in \{0, \ldots, 30\}$, owing to equation (5), a code word of the Reed-Solomon code with the H-matrix according to equation (4), with the result that $$b_x^1, \ldots, b_x^{25}, b_{x,Bf}^{26}, b_c^1, \ldots, b_c^5 + \underbrace{\alpha^J, \ldots, \alpha^J}_{31} \quad (9)$$

is also a code word for any desired $J \in \{0, \ldots, 30\}$.

Equation (9) corresponds, in each byte, to an inversion of the bits which are equal to 1 in the vector representation of $\alpha J$. If, for example, $J=22$ and $\alpha J=10101$, the first, the third, and the fifth bit are inverted in each byte. If, for example, $J'=6$ and $\alpha J'=01010$, the second and the fourth bit are inverted in each byte.

For example, the first assignment bit may be set to $B_1^f=1$ and it may therefore be stipulated that the first bit, the third bit and the fifth[1] bit of each byte of a code word should be inverted. Accordingly, the assignment bit may be $B_1^f=0$ and may therefore indicate that, on account of this assignment bit, no bit of the byte should be inverted on account of the assignment bit.

It is also possible for the second assignment bit with $Bf2=1$ to determine that the second bit and the fourth bit of each byte of a code word should be inverted. Accordingly, this assignment bit with $Bf2=0$ determines that no bit of the byte should be inverted.

If, according to this example, both $B_1^f=1$ and $B_2^f=1$ are set, all bits of the byte are inverted. If both $B_1^f=0$ and $B_2^f=0$, no bit of the byte is inverted. If the bits of the bytes of a code word of the Reed-Solomon code with the H-matrix according to equation (4) are inverted as described above, a code word is again transformed into a code word of this code.

Memory Cells of an Addressable Memory

In a further example, a 1-byte error-correcting and 2-byte error-detecting byte error code with n=64 data bits $x_1, \ldots, x_{64}$ is considered. Data bits and check bits are intended to be stored in memory cells of an addressable memory, wherein the memory cells are addressed by means of a write address $a^S$ when writing to the memory and are addressed by means of a read address $a^L$ when reading from the memory. The Galois field $GF(2^5)$ is used as an example of a Galois field. Each byte comprises 5 bits. There are 12 bytes $$b_x^1 = x_1, \ldots, x_5,$$
$$b_x^2 = x_6, \ldots, x_{10},$$
$$\vdots$$
$$b_x^{12} = x_{56}, \ldots, x_{60},$$

which have only data bits. A thirteenth byte $$b_{x,Zw}^{13} = x_{61}, x_{62}, x_{63}, x_{64}, B_{Zu}^1$$

comprises the remaining four data bits $x_{61}$ to $x_{64}$ and a byte-filling bit $B_{Zu}^1$.
Furthermore, two address bytes having bits $A_1$ to $A_{10}$ derived from address bits are provided:

$$b_A^1 = A_1, A_2, A_3, A_4, A_5,$$

$$b_A^2 = A_6, A_7, A_8, A_9, A_{10}.$$

There are also three check bytes $$b_c^1 = c_1, \ldots, c_5,$$

$$b_c^2 = c_6, \ldots, c_{10},$$

$$b_c^3 = c_{11}, \ldots, c_{15}$$

with the check bits $c_1$ to $c_{15}$.
The bytes $$b_x^1, \ldots, b_x^{12}, b_{x,Zw}^{13}, b_A^1, b_A^2, b_c^1, b_c^2, b_c^3$$

form, in the error-free case, a code word of the byte error code considered here by way of example.
By way of example, the following H-matrix is used:

$$H = \begin{pmatrix} \alpha^0 & \alpha^0 & \alpha^0 & \alpha^0 & \alpha^0 & \alpha^0 & \alpha^0 & \alpha^0 & \alpha^0 & \alpha^0 & \alpha^0 & \alpha^0 & \alpha^0 & \alpha^0 & \alpha^0 & \alpha^0 & \alpha^0 & \alpha^0 \\ \alpha^0 & \alpha^1 & \alpha^2 & \alpha^3 & \alpha^5 & \alpha^6 & \alpha^7 & \alpha^8 & \alpha^9 & \alpha^{10} & \alpha^{12} & \alpha^{13} & \alpha^{14} & \alpha^4 & \alpha^{11} & \alpha^{15} & \alpha^{16} & \alpha^{25} \\ \alpha^0 & \alpha^2 & \alpha^4 & \alpha^6 & \alpha^{10} & \alpha^{12} & \alpha^{14} & \alpha^{16} & \alpha^{18} & \alpha^{20} & \alpha^{24} & \alpha^{26} & \alpha^{28} & \alpha^8 & \alpha^{22} & \alpha^{30} & \alpha^1 & \alpha^{19} \\ 1 & 2 & 3 & 4 & 5 & 6 & 7 & 8 & 9 & 10 & 11 & 12 & 13 & 14 & 15 & 16 & 17 & 18 \end{pmatrix} \quad (10)$$

This H-matrix results, for example, from an H-matrix as described in Fujiwara, E.: Code Design for Dependable Systems, Prentice Hall, 2006, page 65 for d=4 and n=25−1=31 by deleting and swapping columns, wherein the element denoted here by $\alpha 0$ is denoted by 1 in the citation mentioned.

The first three rows in equation (10) describe the H-matrix of the byte error code and the fourth row contains the column numbers of the H-matrix. The elements $\alpha i$ with $0 \leq i \leq 30$ are elements of the Galois field GF(25).

Columns 1 to 13 correspond to the 13 bytes $b_x^1, \ldots b_x^{12}$, $b_{x,Zu}^{13}$, columns 14 and 15 correspond to the two address bytes $b_A^1, b_A^2$ and columns 16 to 18 correspond to the three check bytes $b_c^1, b_c^2, b_c^3$.

If bits are written to memory cells of an addressable memory, address bits $A_1^S, \ldots, A_{10}^S$ derived, for example, from the bits of the write address aS are determined according to the relationship $$b_A s^1, b_A s^2 = A_1^S, \ldots, A_{10}^S = M_a \cdot a^S. \quad (11)$$

If the write address aS has 14 bits, for example, Ma is a binary (10×14) matrix which transforms the 14 address bits into 10 derived address bits $A_1^S, \ldots, A_{10}^S$. The derived address bits then determine the address bytes $$b_A s^1 = A_1^S, \ldots, A_5^S$$

$$b_A s^2 = A_6^S, \ldots, A_{10}^S$$

of the write address $a^S$.

If bits are read from the memory cells of the addressable memory, address bits $A_1^L, \ldots, A_{10}^L$ derived from the bits of the read address aL are determined according to the relationship $$b_A L^1, b_A L^2 = A_1^L, \ldots, A_{10}^L = M_a \cdot a^L, \quad (12)$$

After reading, it is checked whether the possibly incorrect bits which have been read form a code word of the byte error code in combination with the bits $A_1^L, \ldots, A_{10}^L$ derived from the read address aL $$x_1', \ldots, x_{64}', B_{Zu}', c_1', \ldots, c_{15}', A_1^L, \ldots, A_{10}^L$$

and the bytes resulting therefrom.

In the example used here, errors in the data bytes and in the thirteenth byte $b_{x,Zu}^{13}$ can be corrected. In contrast, errors in the address bytes in which there is a discrepancy between the read address information and the write address information, that is to say in the case $$A_1^L, \ldots, A_{10}^L \neq A_1^S, \ldots, A_{10}^S,$$

are intended to be only detected (and not corrected).

An address error may be detected, for example, if there is a 1-byte error in one of the address bytes or if there is a 2-byte error in the address bytes.

Before being written to the memory, the check bytes $b_c^1$, $b_c^2$, $b_c^3$ are determined in such a manner that the bytes $$b_x^1, \ldots, b_x^{12}, b_{x,Zw}^{13}, b_A s^1, b_A s^2, b_c^1, b_c^2, b_c^3$$

(in the error-free case) form a code word of the byte error code.

When reading the memory, it is checked whether the possibly incorrect bits which have been read $$x_1', \ldots, x_{64}', B_{Zu}', c_1', \ldots, c_{15}', A_1^L, \ldots, A_{10}^L$$

and the bytes resulting therefrom $$b_x^{1'}, \ldots b_x^{12'}, b_{x,Zu}^{13'}, b_A L^1, b_A L^2, b_c^{1'}, b_c^{2'}, b_c^{3'},$$

form a code word of the byte error code in the error-free case.

The H-matrix according to equation (10) is determined in such a manner that, for the sum of the components in the 16 columns which correspond to the bytes $$b_x^1, \ldots b_x^{12}, b_{x,Zu}^{13}, b_c^1, b_c^2, b_c^3,$$

the following holds true:

$$\underbrace{\alpha^0, \ldots, \alpha^0}_{16} = 0, \quad (13)$$

since 16 is an even number. The following also apply:

$$\alpha^0 + \alpha^1 + \alpha^2 + \alpha^3 + \alpha^5 + \alpha^6 + \alpha^7 + \alpha^8 + \alpha^9 + \alpha^{10} + \alpha^{12} + \alpha^{13} + \alpha^{14} + \alpha^{15} + \alpha^{16} + \alpha^{25} + = 0 \quad (14)$$

and $$\alpha^0 + \alpha^2 + \alpha^4 + \alpha^6 + \alpha^{10} + \alpha^{12} + \alpha^{14} + \alpha^{16} + \alpha^{18} + \alpha^{20} + \alpha^{24} + \alpha^{26} + \alpha^{28} + \alpha^{30} + \alpha^1 + \alpha^{19} + = 0. \quad (15)$$

The components in columns 14 and 15 of the H-matrix according to equation (10), which are assigned to the address bytes, are not included in equations (13) to (15).

Furthermore, on the basis of this example, it is illustrated how an H-matrix can be determined on the basis of relationships between elements of a Galois field in such a manner that the sum of a desired number of components in the columns of the H-matrix produces the value 0. In this context, reference is made to representations of Galois fields GF(2m), as described, for example, in Lin, S.; Costello, D.: Error Control Coding, Prentice-Hall, 2005, pages 1204 to 1226 for m=3, ..., 10.

For example, the following apply to the Galois field GF(25):

$$\alpha^0 + \alpha^2 + \alpha^5 = 0, \quad (16)$$

and $$\alpha^0 + \alpha^1 + \alpha^2 + \alpha^{11} = 0. \quad (17)$$

The following immediately follow from equation (16)

$$\alpha^1 + \alpha^3 + \alpha^6 = \alpha^1(\alpha^0 + \alpha^2 + \alpha^5) = 0$$

$$\alpha^7 + \alpha^9 + \alpha^{12} = \alpha^7(\alpha^0 + \alpha^2 + \alpha^5) = 0$$

$$\alpha^8 + \alpha^{10} + \alpha^{13} = \alpha^8(\alpha^0 + \alpha^2 + \alpha^5) = 0$$

and the following results from equation (17)

$$\alpha^{14} + \alpha^{15} + \alpha^{16} + \alpha^{25} = \alpha^{14}(\alpha^0 + \alpha^1 + \alpha^2 + \alpha^{11}) = 0.$$

The relationship according to equation (14) therefore follows, in conjunction with equation (16), by summing the equations. Equation (15) then follows from the validity of equation (14) by squaring since the addition of two identical terms in a Galois field GF(2m) results in 0 and the mixed terms cancel one another out.

Further Embodiments

FIG. 1 shows an example circuit arrangement comprising a multiplicity of XOR circuits 11, 12, 14, 17, 18, 19, 110 and 111, a check value former 13, a memory 15 and a correction value former 16. There are 128 data bits x, a first byte-filling bit $B_{Zu}^1$ and a second byte-filling bit $B_{Zu}^2$ at the input of the circuit.

The 128 data bits x are supplied to the first input of the XOR circuit 11.

The output of the XOR circuit 11 is connected to the memory 15. The first byte-filling bit B1Zu is supplied to the second input of the XOR circuit 11, to the second input of the XOR circuit 12, to the second input of the XOR circuit 14 and to the memory 15. The second byte-filling bit B2Zu is supplied to the first input of the XOR circuit 12. The output of the XOR circuit 12 is connected to the memory 15.

The check value former 13 has three inputs and one output. The 128 data bits x are present at the first input of the check value former 13, a signal "0" is present at its second input and the second byte-filling bit B2Zu is present at its third input. The output of the check value former 13 is connected to the first input of the XOR circuit 14. The output of the XOR circuit 14 is connected to the memory 15.

The 128 data bits $$x = x_1, \ldots, x_{128}$$

are supplemented by a first byte-filling bit $B^1_{Zu}$ and a second byte-filling bit $B^2_{Zu}$ to form a total of 130 bits. In this example, a byte size of 5 bits is selected. The 130 bits accordingly result in 26 bytes which are protected by a byte error code using 5 additional check bytes $c^1$ to $c^5$ (comprising 25 check bits $c_1$ to $c_{25}$). Overall, there are therefore 31 bytes or 155 bits which represent a code word of the byte error code in the error-free case. These can be stored in the memory 15.

As an example of a byte error code, it is possible to use a 2-byte error-correcting and 3-byte error-detecting Reed-Solomon code in a Galois field GF(25). This Reed-Solomon code has, for example, (25-1)=31 bytes, each of which comprises 5 bits. The Reed-Solomon code is a linear code which is known to a person skilled in the art and can be determined by its H-matrix. The elements of the H-matrix are described in this case as elements $$\alpha^0, \alpha^1, \ldots, \alpha^{30}$$

of the Galois field $GF(2^5)$ or in binary form. The binary form of the H-matrix results from the H-matrix with components $\alpha^i$ of the Galois field if the elements $\alpha^i$ for $i \in \{0, \ldots, 30\}$ of the Galois field are represented as binary matrices in their matrix form $$T^i = (\alpha^i |, \alpha^{i+1} |, \alpha^{i+2} |, \alpha^{i+3}, \alpha^{i+4} |)$$

for i=0, 1, ..., 30. In this case, $$(\alpha^i |, \alpha^{i+1} |, \alpha^{i+2} |, \alpha^{i+3}, \alpha^{i+4} |)$$

are the vector representations of the elements $\alpha^i$ to $\alpha^{i+4}$ each in the form of 5-component column vectors, with the result that $T^i$ is a binary 5×5 matrix which forms the matrix form of the element $\alpha^i$. The matrix form of elements of a Galois field is described, for example, in Rao, T.; Fujiwara, E.: Error control Coding for Computer Systems, Prentice Hall, 1989, pages 109 to 114, pages 110 and 111.

As explained above, the byte-filling bits may be assignment bits which are linked to a functionality.

If, for example, the first assignment bit B1zu is equal to 1, the first assignment bit B1zu is stored in the memory 15 without change and the 128 data bits x, the second assignment bit B2zu and the 25 check bits are stored in an inverted manner in the memory The value 0 is present at the second input of the check value former 13 (in contrast to the value 1 of the first assignment bit B1zu which indicates the inversion). On the basis of the signals present at its inputs, the check value former 13 determines the 25 check bits of the byte error code used and outputs them to the XOR circuit 14.

In accordance with the H-matrix of the code used (here, for example, the Reed-Solomon code), the check value former 13 determines the 25 check bits (that is to say 5 check bytes) on the basis of the signals present at its inputs. In this case, the H-matrix can be used in its binary form. The check value former 13 determines the 25 check bits for the linear code determined by its binary H-matrix. The check value former 13 can be implemented as a combinational circuit. Parts of the check value former 13 may be implemented as hardware and/or software.

The 128 data bits x are linked in the XOR circuit 11, in a component-by-component manner, to the first assignment bit B1zu:

$$x + B_{Zu}^1 = x_1 + B_{Zu}^1, \ldots, x_{128} + B_{Zu}^1.$$

If the first assignment bit is B1Zu=1, the 128 data bits x are output in a manner inverted component-by-component at the outputs of the XOR circuit 11. If the first assignment bit is B1Zu=0, the 128 data bits x are output without change at the outputs of the XOR circuit 11.

The 25 check bits $$c = c_1, \ldots, c_{25}$$

are linked in the XOR circuit 14, in a component-by-component manner, to the first assignment bit B1zu:

$$c + B_{Zu}^1 = c_1 + B_{Zu}^2, \ldots, c_{25} + B_{Zu}^1$$

If the first assignment bit is B1Zu=1, the 25 check bits c1 to c25 are output in a manner inverted component-by-component at the outputs of the XOR circuit 14. If the first assignment bit is B1Zu=0, the 25 check bits c1 to c25 output without change at the outputs of the XOR circuit 14.

The second assignment bit B2Zu is linked in the XOR gate 12 to the first assignment bit B1Zu:

$$B_{Zu}^1 + B_{Zu}^2.$$

If the first assignment bit is B1Zu=0, the 128 data bits x, the two assignment bits B2Zu and B1Zu and the check bits c are stored without change in the memory 15.

If the first assignment bit is B1Zu=1, the 128 data bits x, the second assignment bit B2Zu and the check bits c are stored in an inverted manner in the memory 15 and the first assignment bit B1Zu=1 is stored in the memory 15.

The bit combination comprising the bits $$x, B_{Zu}^1 = 0, B_{Zu}^2, c$$

is a code word of the byte error code in the error-free case. The byte error code is determined in such a manner that the bit combination $$\bar{x}, B_{Zu}^1 = 1, \bar{B}_{Zu}^2, \bar{c}$$

with $$\bar{x} = \bar{x}_1, \ldots, \bar{x}_{128}$$

$$\bar{c} = \bar{c}_1, \ldots, \bar{c}_{25}$$

is also a code word of the byte error code.

During read access to the memory 15, the possibly incorrect components of bits result on the basis of the links described above:

$$(x + B_{Zu}^1)', B_{Zu}^{1'}, (B_{Zu}^2 + B_{Zu}^1)', (c + B_{Zu}^1)'$$

Each of these components is present at an input of the correction value former 16. Based on the signals present at its inputs, the correction value former 16 determines correction values ex, eB1Zu, eB2Zu. Each of these correction values is provided at an output of the correction value former 16.

The formation of correction bits for Reed-Solomon codes is known to a person skilled in the art. In this case, the correction value former may be implemented as hardware, as software or as a combination of hardware and software. The formation of check bits and the decoding of a 2-byte error-correcting Reed-Solomon code are explained, for example, in DE 102017125617.

The components mentioned above are linked to the correction values via XOR circuits. These result in corrected values of the 128 data bits xcor, of the first assignment bit $B_{Zu}^{1,cor}$ and of the second assignment bit $B_{Zu}^{2,cor}$, which are provided at the output of the circuit shown in FIG. 1 at the outputs of the XOR circuits 18, 19 and 111.

The following link is implemented using the XOR circuit 17:

$$(x+B_{Zu}^{1})'+ex=(x+B_{Zu}^{1})^{cor}.$$

The following link is implemented using the XOR circuit 19:

$$B_{Zu}^{1'}+eB_{Zu}^{1}=B_{Zu}^{1,cor}.$$

The following link is implemented using the XOR circuit 18:

$$(x+B_{Zu}^{1})^{cor}+B_{Zu}^{1,cor}=x^{cor}.$$

The following link is implemented using the XOR circuit 110:

$$(B_{Zu}^{2}+B_{Zu}^{1})'+eB_{Zu}^{2}=(B_{Zu}^{2}+B_{Zu}^{1})^{cor}.$$

The following link is implemented using the XOR circuit 111:

$$(B_{Zu}^{2}+B_{Zu}^{1})^{cor}+B_{Zu}^{1,cor}=B_{Zu}^{2,cor}.$$

In this case, it is advantageous that the assignment signals themselves are concomitantly included in error correction. Alternatively, the assignment signals might not be concomitantly included in error correction.

The second assignment bit B2Zu could code, for example, a further functionality, for example whether the data bits (or parts of the data bits) are valid or invalid or are intended to be able to be read or not able to be read from the outside.

Although embodiments of the disclosure have been described and illustrated more specifically in detail by means of the at least one example shown, the disclosure is not restricted thereto and other variations may be derived therefrom by a person skilled in the art without departing from the scope of protection of the disclosure.

What is claimed is:

1. A method for storing data bits having at least one byte-filling bit in memory cells, the method comprising:
   coding, in the at least one-byte-filling bit, at least one predefined functionality for a subset of the data bits; and
   storing the data bits in the memory cells,
   wherein the data bits are grouped, together with check bits, into bytes, wherein at least one of these bytes can be corrected based on a byte error code, wherein the data bits and the check bits are stored in the memory cells,
   wherein, in an error-free case, the data bits and the check bits represent a code word of the byte error code or are parts of a code word of the byte error code,
   wherein the byte error code has N check bytes having check bits,
   wherein a byte comprises m bits,
   wherein there is a byte which has K byte-filling bits and m−K data bits,
   wherein m is determined as a smallest positive integer so that $$m\cdot(2m-1)\geq n+(N\cdot m)+K$$

where m≥3, 1≤K≤m−1, N≥2 and n>(N+2)·m, and
   where n is a number of data bits.

2. The method of claim 1, further comprising:
   storing the data bits in the memory cells based on the at least one predefined functionality coded in the at least one byte-filling bit.

3. The method of the claim 1, wherein the subset of the data bits comprises the data bits excluding the at least one byte-filling bit.

4. The method the of claim 1, wherein the subset of the data bits comprises all of the data bits.

5. The method of claim 1, wherein the at least one predefined functionality coded in the at least one byte-filling bit comprises one of:
   a first value of the byte-filling bit indicates that the subset of the data bits is stored in an inverted manner and a second value of the byte-filling bit indicates that the subset of the data bits is stored in a non-inverted manner;
   a first value of the byte-filling bit indicates that the subset of the data bits is invalid and a second value of the byte-filling bit indicates that the subset of the data bits is valid;
   a first value of the byte-filling bit indicates that the subset of the data bits can be overwritten and a second value of the byte-filling bit indicates that the subset of the data bits cannot be overwritten;
   a first value of the byte-filling bit indicates that the subset of the data bits cannot be read and a second value of the byte-filling bit indicates that the subset of the data bits can be read; or
   a first value of the byte-filling bit indicates that the subset of the data bits is protected and a second value of the byte-filling bit indicates that the subset of the data bits is not protected.

6. The method of claim 1, wherein the at least one byte-filling bit is used to detect errors in the data bits.

7. The method of claim 1, wherein the check bits are determined based on address bits.

8. The method of claim 7,
   wherein the byte error code has R address bytes determined from address bits,
   wherein m is determined as a smallest positive integer so that $$m\cdot(2^{m}-1)\geq n+(N\cdot m)+(R\cdot m)+K$$

where m≥3, 1≤K≤m−1, N≥2, R≥1 and n>(N+R+2)·(m).

9. The method of claim 8, wherein the address bits are part of the code word of the byte error code.

10. The method of claim 9, wherein the address bits are not part of the code word of the byte error code.

11. A method for reading data bits having at least one byte-filling bit from memory cells, the method comprising:
    coding, in the at least one byte-filling bit, at least one predefined functionality for a subset of the data bits; and
    reading the data bits from the memory cells based on the at least one predefined functionality coded in the at least one byte-filling bit,
    wherein the data bits are grouped, together with check bits, into bytes, wherein at least one of these bytes can be corrected based on a byte error code, wherein the data bits and the check bits are stored in the memory cells, wherein, in an error-free case, the data bits and the check bits represent a code word of the byte error code or are parts of a code word of the byte error code, wherein the check bits are determined based on address bits, wherein the byte error code has N check bytes, wherein the byte error code has R address bytes determined from address bits, wherein a byte comprises m bits, wherein there is a byte which has K byte-filling bits and m−K data bits, wherein m is determined as a smallest positive integer so that $$m \cdot (2m-1) \geq n + (N \cdot m) + (R \cdot m) + K$$

where $m \geq 3$, $1 \leq K \leq m-1$, $N \geq 2$, $R \geq 1$ and $n > (N+R+2) \cdot (m)$, and where n is a number of data bits.

12. The method of claim 11, further comprising:
determining, based on the data bits which have been read, whether there is a code word of the byte error code; and
detecting and/or correcting at least one error if there is no code word of the byte error code.

13. The method of claim 12, wherein, if there is a code word of the byte error code and if at least one detected error has been corrected, the data bits which have been read are processed further.

14. A processor for storing and reading data bits having at least one byte-filling bit in memory cells of a memory, the processor configured to:
code, in the at least one-byte-filling bit, at least one predefined functionality for a subset of the data bits;
store the data bits in the memory cells; and
read the data bits from the memory cells based on the at least one predefined functionality coded in the at least one byte-filling bit, wherein the data bits are grouped, together with check bits, into bytes, wherein at least one of these bytes can be corrected based on a byte error code, wherein the data bits and the check bits are stored in the memory cells, wherein, in an error-free case, the data bits and the check bits represent a code word of the byte error code or are parts of a code word of the byte error code, wherein the byte error code has N check bytes having check bits, wherein a byte comprises m bits, wherein there is a byte which has K byte-filling bits and m−K data bits, wherein m is determined as a smallest positive integer so that $$m \cdot (2m-1) \geq n + (N \cdot m) + K$$

where $m \geq 3$, $1 \leq K \leq m-1$, $N \geq 2$ and $n > (N+2) \cdot m$, and where n is a number of data bits.

15. The processor of claim 14, wherein the processor is part of the memory or part of a memory management system.

16. The processor of claim 14, wherein the memory comprises at least one of: a cache memory, a register or a register array, a flash memory, an MRAM, an SRAM, an RERAM, a PC-RAM, an FE-RAM, a CB-RAM, a multi-bit memory, a multi-level memory.

17. The processor of claim 14, wherein the processor is further configured to:
determine, based on the data bits which have been read, whether there is a code word of the byte error code; and
detecting and/or correcting at least one error if there is no code word of the byte error code.

* * * * *